United States Patent
Huang et al.

(10) Patent No.: US 12,295,252 B2
(45) Date of Patent: May 6, 2025

(54) MULTIPLE CATION-DOPED PEROVSKITE COMPOUND AND PEROVSKITE SOLAR CELL INCLUDING THE SAME

(71) Applicant: MING CHI UNIVERSITY OF TECHNOLOGY, New Taipei (TW)

(72) Inventors: Yu-Ching Huang, New Taipei (TW); Sheng-Wen Huang, New Taipei (TW); Chia-Feng Li, New Taipei (TW); Wei-Fang Su, New Taipei (TW)

(73) Assignee: MING CHI UNIVERSITY OF TECHNOLOGY, New Taipei (TW)

( * ) Notice: Subject to any disclaimer, the term of this patent is extended or adjusted under 35 U.S.C. 154(b) by 0 days.

(21) Appl. No.: 18/225,055

(22) Filed: Jul. 21, 2023

(65) Prior Publication Data

US 2024/0324448 A1    Sep. 26, 2024

(30) Foreign Application Priority Data

Mar. 21, 2023  (TW) .................. 112110470

(51) Int. Cl.
*H10K 85/50* (2023.01)
*C07F 7/24* (2006.01)
*H10K 30/50* (2023.01)
*H10K 85/20* (2023.01)

(52) U.S. Cl.
CPC .............. *H10K 85/50* (2023.02); *C07F 7/24* (2013.01); *H10K 30/50* (2023.02); *H10K 85/211* (2023.02); *H10K 85/215* (2023.02)

(58) Field of Classification Search
CPC .... H10K 85/50; H10K 85/215; H10K 85/211; H10K 30/50
See application file for complete search history.

(56) References Cited

U.S. PATENT DOCUMENTS

| | | | |
|---|---|---|---|
| 2022/0246872 A1* | 8/2022 | Williams | H10K 30/151 |
| 2024/0138164 A1* | 4/2024 | Berry | H10K 30/81 |
| 2024/0188407 A1* | 6/2024 | Palmstrom | H10K 71/311 |

OTHER PUBLICATIONS

Scalon et al., Improving the Stability and Efficiency of Perovskie Solar Cells by a Bidentate Anilinium Salt, Journal of American Chemical Society, vol. /issue 2, pp. 1306-1312 (Year: 2022).*
Calio et al., Hole-Transport Materials for Perovskite Solar Cells, Angewandte Chemie, pp. 14522-14545 (Year: 2016).*
Chung et al., Phosphonic Acid and Lithium Salt as Effective p-Dopants to Oxidize Spiro-OMeTAD for Mesoscopic Sb2Sb3 Solar cells, Journal of Physical Chemistry, pp. 18472-18479 (Year: 2017).*

* cited by examiner

*Primary Examiner* — Jayne L Mershon
(74) *Attorney, Agent, or Firm* — MUNCY, GEISSLER, OLDS & LOWE, P.C.

(57) ABSTRACT

A multiple cation-doped perovskite compound includes a perovskite represented by a formula of $ABX_3$. A includes M1, M2, and M3. M1 represents a cation different from M2 and M3; M2 represents a cesium ion and M3 represents a formamidinium ion. B represents a divalent cation different from M1, M2, and M3. X includes at least two different halide ions. In addition, the perovskite compound is free from methylamine ion. A perovskite solar cell including the multiple cation-doped perovskite compound is also provided.

7 Claims, 3 Drawing Sheets

MULTIPLE CATION-DOPED PEROVSKITE COMPOUND AND PEROVSKITE SOLAR CELL INCLUDING THE SAME

CROSS-REFERENCE TO RELATED APPLICATION

This application claims priority to Taiwanese Invention patent application No. 112110470, filed on Mar. 21, 2023.

FIELD

The disclosure relates to a perovskite compound and a perovskite solar cell including the same, and more particularly to a multiple cation-doped perovskite compound and a perovskite solar cell including the same.

BACKGROUND

A perovskite compound offers advantages including being easy to manufacture, having an adjustable band gap and a lower production cost, and having its raw materials easily accessible compared to a conventional silicon solar cell, which nowadays faces a high cost of raw materials. Hence, the perovskite compound is increasingly becoming one of the most popular materials for making solar cells. Despite of the above advantages, further improving photoelectric conversion efficiency (PCE) of the perovskite compound to use as an absorption layer of a solar cell and widening the band gap of the perovskite compound by material selection are focuses of current research.

At present, when the perovskite compound is a metal halide perovskite, it has good PCE. In addition, when the metal halide perovskite contains two different halide ions, it can increase its band gap up to 1.5 eV. Furthermore, by adjusting a ratio of the two different halide ions, wavelength of absorption band of the perovskite compound may easily be adjusted to fall between 400 nm and 800 nm, which covers approximately an entire visible wavelength range, thereby making the perovskite compound more flexible in applications.

However, when the perovskite compound contains multiple halide ions, segregation of the halide ions is prone to occur when illuminated, which leads to photoinduced phase separation. If such perovskite compound is to be used as the absorption layer of the solar cell, one of the halide ions will concentrate in one area of the absorption layer and another of the halide ions will concentrate in another area of the absorption layer, causing uneven band gap distribution in the absorption layer and thus resulting in the reduction of PCE of solar cell.

Therefore, there is still a need for those skilled in the art to develop a perovskite compound that can avoid the occurrence of photoinduced phase separation while in the meantime maintaining PCE.

SUMMARY

Accordingly, in a first aspect, the present disclosure provides a multiple cation-doped perovskite compound, which can alleviate at least one of the drawbacks of the prior art. The multiple cation-doped perovskite compound includes a perovskite represented by formula (I):

$$ABX_3 \quad (I)$$

wherein:
A includes M1, M2, and M3, M1 representing a cation different from M2 and M3, M2 representing a cesium ion and M3 representing a formamidinium ion;
B represents a divalent cation different from M1, M2, and M3;
X includes at least two different halide ions; and
the perovskite compound is free from methylammonium ion.

In a second aspect, the present disclosure provides a perovskite solar cell, which can alleviate at least one of the drawbacks of the prior art. The perovskite solar cell includes:
a conductive layer;
a hole transport layer disposed on the conductive layer;
an absorption layer disposed on the hole transport layer opposite to the conductive layer, and including the aforesaid multiple cation-doped perovskite compound;
a passivation film disposed on the absorption layer opposite to the hole transport layer;
an electron transport layer disposed on the passivation film opposite to the absorption layer;
an electrode contact layer disposed on the electron transport layer opposite to the passivation film; and
an electrode layer disposed on the electrode contact layer opposite to the electron transport layer.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
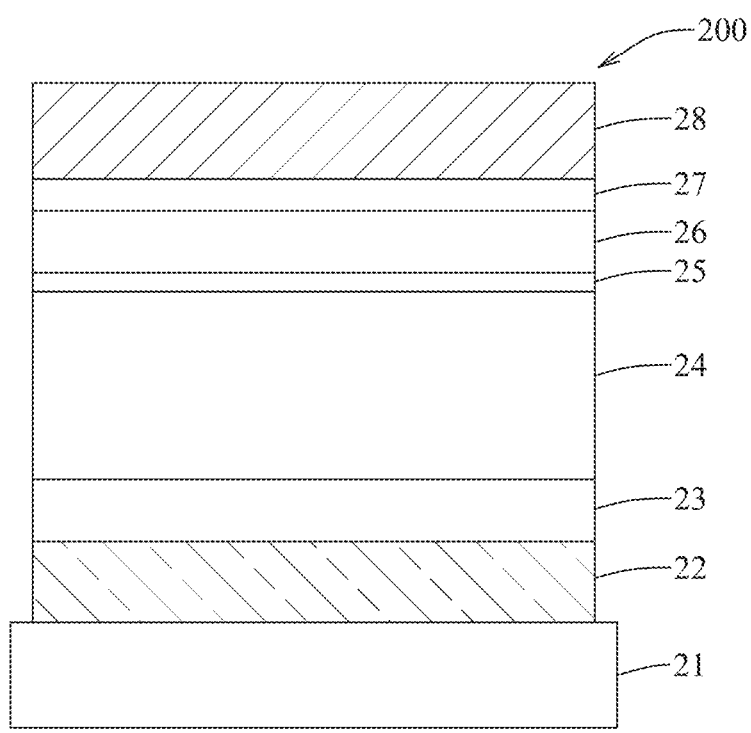
FIG. 1 is a schematic view illustrating an embodiment of a perovskite solar cell according to the disclosure.

Before the present disclosure is described in greater detail, it should be noted that if any prior art publication is referred to herein, such reference does not constitute an admission that the publication forms a part of the common general knowledge in the art, in Taiwan or any other country.

For the purpose of this specification, it will be clearly understood that the word "comprising" means "including but not limited to," and that the word "comprises" has a corresponding meaning.

Unless otherwise defined, all technical and scientific terms used herein have the meaning commonly understood by a person skilled in the art to which the present disclosure belongs. One skilled in the art will recognize many methods and materials similar or equivalent to those described herein, which could be used in the practice of the present disclosure. Indeed, the present disclosure is in no way limited to the methods and materials described.

The present disclosure provides a multiple cation-doped perovskite compound including a perovskite represented by formula (I):

$$ABX_3 \quad (I)$$

wherein:
A includes M1, M2, and M3, M1 representing a cation different from M2 and M3, M2 representing a cesium ion (Cs⁺) and M3 representing a formamidinium ion (FA⁺);
B represents a divalent cation different from M1, M2, and M3;
X includes at least two different halide ions; and
the perovskite compound is free from methylammonium ion.

In certain embodiments, the perovskite may be represented by formula (II):

$$M1_S(M2_TM3_{1-T})_{1-S}BX_3 \quad (II)$$

wherein:
S represents a value greater than 0 and lower than 0.1; and
T represents a value greater than 0 and lower than 0.5.

In certain embodiments, the perovskite may be represented by formula (III):

$$M1_S(M2_TM3_{1-T})_{1-S}B(X1_{1-U}X2_U)_3 \quad (III)$$

wherein:
X1 represents an iodide ion (I⁻);
X2 represents a bromide ion (Br⁻); and
U represents a value greater than 0 and lower than 0.5.

In certain embodiments, M1 may be selected from the group consisting of a lithium ion, a sodium ion, a potassium ion, a rubidium ion, a magnesium ion, a calcium ion, a strontium ion, a barium ion, an acetamidinium ion, a dimethylammonium ion and a methylenediammonium ion, and B may be selected from the group consisting of a lead ion (Pb²⁺), a tin ion (Sn²⁺) and a germanium ion (Ge²⁺).

It should be noted that by utilizing the cesium ion (i.e., M2) and the formamidinium ion (i.e., M3), carrier diffusion length in the multiple cation-doped perovskite compound may be shortened, thereby enhancing photoelectric conversion efficiency (PCE) of the multiple cation-doped perovskite compound. In addition, the presence of the cesium ion not only may increase photostability of the multiple cation-doped perovskite compound, but may also effectively suppress the occurrence of segregation of the iodide ion (X1) and the bromide ion (X2) with the increase of cesium ion content, so that photoinduced phase separation caused by mixing of various halide ions may thus be ameliorated. However, since the cesium ion has a radius (0.167 nm) less than that of the formamidinium ion (0.19 nm to 0.22 nm), microstrain may be generated in the interior of the multiple cation-doped perovskite compound, when the concentration of the cesium ion becomes too high (i.e., T is greater than 0.3), resulting in a phase separation. As such, band gap of the photosensitive phase of the multiple cation-doped perovskite compound may instead become smaller, leading to a reduction in an open-circuit voltage (Voc). Therefore, according to the present disclosure, by virtue of the multiple cation-doped perovskite compound being doped with another cation (M1), the occurrence of phase separation caused by mixing together of the cesium ion and the formamidinium ion may be prevented. Furthermore, due to poor thermal stability of methylammonium ion (MA⁺), the multiple cation-doped perovskite compound according to the present disclosure is free from methylammonium ion so that the thermal stability of the multiple cation-doped perovskite compound may be improved.

In an exemplary embodiment, M1 is a rubidium ion (Rb⁺), and by an adding of the rubidium ion, not only the occurrence of phase separation in the multiple cation-doped perovskite compound may be prevented, but PCE of the multiple cation-doped perovskite compound, when used to serve as an absorption layer in a solar cell, can be enhanced.

In certain embodiments, the perovskite may be represented by formula (IV):

$$M1_S(M2_TM3_{1-T})_{1-S}B(X1_uX2_{1-U})_3 \quad (IV)$$

wherein:
S represents a value ranging from 0.01 to 0.10;
T represents a value not lower than 0.1 and not greater than 0.3; and
U represents a value not lower than 0.1 and not greater than 0.3.

In certain embodiments, the perovskite may be represented by the formula (IV) as defined above, wherein T represents a value not lower than 0.3 and not greater than 0.5.

In certain embodiments, the perovskite may be represented by the formula (IV) as defined above, wherein S represents a value of 0.05, T represents a value of 0.3, and U represents a value of 0.2.

In an exemplary embodiment, the perovskite is represented by a formula of $Rb_{0.05}(Cs_{0.3}FA_{0.7})_{0.95}Pb(I_{0.85}Br_{0.15})_3$.

Figure 2:
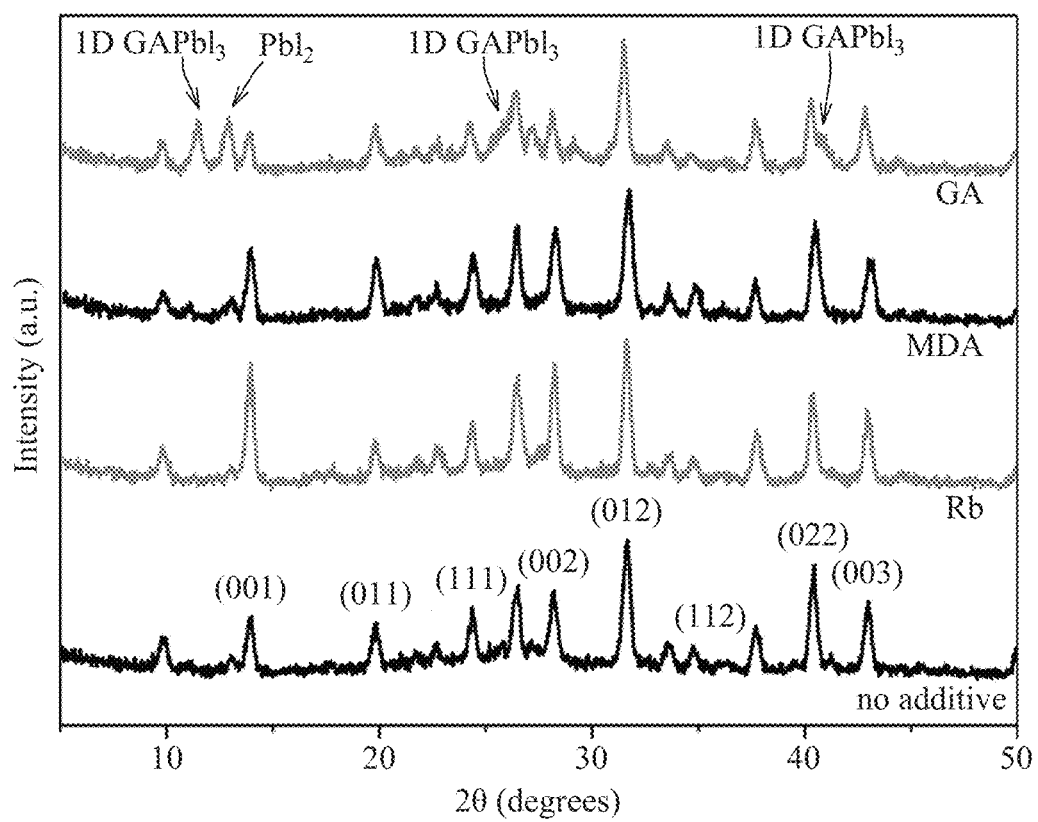
FIG. 2 an X-Ray diffraction (XRD) graph showing curves of a respective one of different perovskite compounds.

FIG. 2 shows an X-Ray diffraction (XRD) analysis of various perovskites, each of which contains the cesium ion (Cs⁺ serving as M2) and the formamidinium ion (FA⁺ serving as M3), but is doped with a distinct M1. Referring to FIG. 2, the perovskites, from top to bottom, are a perovskite represented by a formula of $GA_{0.05}(Cs_TFA_{1-T})_{0.95}Pb(I_UBr_{1-U})_3$ (i.e., with doping of a guanidinium ion (GA⁺) serving as M1), a perovskite represented by a formula of $MDA_{0.05}(Cs_TFA_{1-T})_{0.95}Pb(I_UBr_{1-U})_3$ (i.e., with doping of a methylenediammonium ion (MDA⁺) serving as M1), a perovskite represented by a formula of $Rb_{0.05}(Cs_TFA_{1-T})_{0.95}Pb(I_UBr_{1-U})_3$ (i.e., with doping of a rubidium ion (Rb⁺) serving as M1), and a perovskite represented by a formula of $(Cs_TFA_{1-T})_{0.95}Pb(I_UBr_{1-U})_3$ (i.e., without doping of M1), respectively. As shown in FIG. 2, compared with the perovskite not doped with M1 (i.e., the XRD pattern marked as no additive), the perovskite doped with the guanidinium ion has more peaks, which indicates that the perovskite doped with the guanidinium ion has undesired crystalline precipitates of $GaPbI_3$ and $PbI_2$. However, each of the perovskites doped with the rubidium ion and the perovskite doped with the methylenediammonium ion has no undesired crystalline precipitate. These results reveal that with supplement of the rubidium ion and the methylenediammonium ion, each of which serves as an additional doping cation, i.e., M1, the occurrence of phase separation may be effectively prevented.

According to the present disclosure, the perovskite compound is subjected to determination of Goldschmidt tolerance factor (t) so as to assess stability of the perovskite crystal structure. The tolerance factor (t) is calculated using the following Equation (1):

$$t = \frac{r_a + r_x}{\sqrt{2}\,(r_b + r_x)} \quad (1)$$

where $r_a$=average effective radius of A (including M1, M2 and M3)

$r_b$=effective radius of B $r_x$=average effective radius of X (including X1 and X2)

The result shows that the perovskite compound has a tolerance factor (t) ranging from 0.9 to 1.1.

It should be noted that, supposing that M2, M3, B, X1, and X2 in the perovskite are given, adjustment of the tolerance factor (t) of the multiple cation-doped perovskite compound according to the present disclosure is by selection of M1 and alteration of the ratio of M1 in the multiple cation-doped perovskite compound.

In certain embodiments, by selecting and adjusting the ratio of M1 to make the tolerance factor (t) of the multiple cation-doped perovskite compound range from 0.9 to 1.0, a cubic crystal structure is more likely to form.

Referring to FIG. 1, the above-mentioned multiple cation-doped perovskite compound may be applied in an absorption layer 24 of a perovskite solar cell 200 as an embodiment herein. In this embodiment, the perovskite solar cell 200, which is a reverse p-intrinsic-n junction solar cell, includes a substrate 21, a conductive layer 22, a hole transport layer 23, the absorption layer 24, a passivation film 25, an electron transport layer 26, an electrode contact layer 27, and an electrode layer 28.

The substrate 21 is utilized to carry various layers and/or films disposed thereon, and may be made of a transparent material or an opaque material.

The conductive layer 22 is disposed on the substrate 21, and may be made of a transparent conductive material, such as indium tin oxide (ITO) or fluorine-doped tin oxide (FTO).

The hole transparent layer 23 is disposed on the conductive layer 22 opposite to the substrate 21 and is a monomolecular layer. In certain embodiments, the hole transport layer 23 may be made of a material selected from the group consisting of a boronic acid derivative, a carboxylic acid derivative, a cyanoacetic acid derivative, and a phosphonic acid derivative (such as [2-(3,6-Dimethoxy-9H-carbazol-9-yl)ethyl]phosphonic acid (MeO-2PACz)).

The absorption layer 24 is disposed on the hole transport layer 23 opposite to the conductive layer 22, and includes the aforesaid multiple cation-doped perovskite compound.

The passivation film 25 is disposed on the absorption layer 24 opposite to the hole transport layer 23, and is utilized to reduce defect density of the multiple cation-doped perovskite compound. Moreover, materials for making the passivation film 25 may include, but are not limited to, an alkylammonium halide (R—NH$_3$X, where R=an alkyl group and X=a halogen), a phenethylammonium halide (PEAX, where X=a halogen) and a 2-thiopheneethylammonium halide (TEAX, where X=a halogen).

The electron transport layer 26 is disposed on the passivation film 25 opposite to the absorption layer 24. That is to say, the passivation film 25 is disposed between the absorption layer 24 and the electron transport layer 26, and by such arrangement, the passivation film 25 may be utilized to enhance matching of the energy level between the interface of the absorption layer 24 and the electron transport layer 26. In certain embodiments, the electron transport layer 26 may be made of a material selected from the group consisting of [6,6]-phenyl-C61-butyric acid methyl ester (PCBM), indene-C60 bisadduct (ICBA), fullerene $C_{60}$, fullerene $C_{70}$, and [6,6]-phenyl-C71-butyric acid methyl ester (PC$_{71}$BM).

The electrode contact layer 27 is disposed on the electron transport layer 26 opposite to the passivation film 25, and is adjacent to the electrode layer 28 to modify work function of the electrode layer 28, thereby facilitating electron transfer from the electron transport layer 26 to the electrode layer 28. Moreover, materials for making the electrode contact layer 27 may include, but are not limited to, polyethylenimine (PEI), polyethylenimine ethoxylated (PEIE), bathocuproine (BCP), and zirconium acetylacetonate (Zr(acac)$_4$).

The electrode layer 28 is disposed on the electrode contact layer 27 opposite to the electron transport layer 26. In certain embodiments, the electrode layer 28 may be made of a material selected from the group consisting of silver, gold, copper, aluminum, palladium, nickel, and combinations thereof. In certain embodiments, the electrode layer 28 may be made of a transparent conductive material selected from the group consisting of indium tin oxide (ITO), fluorine-doped tin oxide (FTO), antimony-doped tin oxide (ATO), aluminum-doped zinc oxide (AZO), indium-doped zinc oxide (IZO), gallium-doped zinc oxide (GZO), indium tin zinc oxide (ITZO), indium gallium zinc oxide (IGZO), and combinations thereof. In certain embodiments, the electrode layer 28 may be made of a material selected from the group consisting of silver, gold, copper, aluminum, palladium, nickel, ITO, FTO, ATO, AZO, IZO, GZO, ITZO, IGZO, and combinations thereof.

In should be noted that, in some embodiments, the perovskite solar cell 200 may be configured without the substrate 21 as desired.

In other embodiments, the multiple cation-doped perovskite compound may be applied in an n-intrinsic-p junction perovskite cell solar or a perovskite tandem solar cell having various absorption layers with different bandgaps.

The present disclosure will be further described by way of the following examples. However, it should be understood that the following examples are indented solely for the purpose of illustration and should not be construed as limiting the present disclosure in practice.

EXAMPLES

Preparation of Perovskite Solar Cell

Example 1

First, a conductive glass having an indium tin oxide (ITO) layer (serving as a conductive layer) disposed thereon was provided, and then was subjected to an ultraviolet ozone (UVO) treatment using a UVO cleaner (TRUSTER Co., Ltd., Model: TLH2020BOX) for surface cleansing, so as to make a surface of the ITO layer hydrophilic. Afterward, the surface of the ITO layer was coated using a first solution so as to form a first film thereon, followed by annealing at 100° C. and cooling down the temperature, thereby forming a hole transport layer. The first solution was a MeO-2PACz solution having a concentration of 0.3 mg/ml prepared by using absolute ethanol as a solvent.

Subsequently, an antisolvent process was carried out as follows. A surface of the hole transport layer was coated using a perovskite precursor solution, and during the coating process, an antisolvent (ether or ethyl acetate) was added to the perovskite precursor film, followed by annealing at 150° C. thereby forming an absorption layer made of a perovskite compound.

The foregoing perovskite precursor solution was a solution having a concentration of 1.4 M, and included a solvent and a precursor raw material. The solvent was prepared by mixing dimethylformamide (DMF) and dimethylsulfoxide (DMSO) in a volume ratio of 4:1. In addition, the precursor raw material was the perovskite compound made from rubidium iodide (RbI), cesium iodide (CsI), formamidinium iodide (FAI), formamidinium bromide (FABr), and lead iodide (PbI$_2$), and may be presented by a formula of Rb$_{0.05}$(Cs$_{0.3}$FA$_{0.7}$)$_{0.95}$Pb(I$_{0.85}$Br$_{0.15}$)$_3$.

Next, a surface of the absorption layer was coated using a second solution for passivating the perovskite compound, followed by annealing at 150° C., thereby obtaining a passivation film. The second solution was a 2-thiopheneethylammonium chloride (TEACl) solution having a concentration ranging from 1 mM to 4 mM prepared by using isopropanol as a solvent.

Afterwards, an electron transport layer, which was formed by coating a surface of the passivation film with a third solution, and an electrode contact layer, which was formed by coating a surface of the electron transport layer with a fourth solution, were sequentially stacked. The third solution was a PCBM solution having a concentration of 20 mg/ml prepared by using chlorobenzene as a solvent. Moreover, the fourth solution was a PEI solution having a concentration of 0.1 wt % prepared by using isopropanol as a solvent.

Finally, an electrode layer made of silver and having a thickness of approximately 100 nm to 120 nm was formed on a surface of the electrode contact layer via vapor deposition, and a perovskite solar cell was thus obtained.

Comparative Example 1

The procedures for preparing a perovskite solar cell in Comparative Example 1 were similar to those of Example 1, except that the precursor raw material of the perovskite precursor solution in Comparative Example 1 was made from cesium iodide (CsI), formamidinium iodide (FAI), formamidinium bromide (FABr) and lead iodide (PbI$_2$), which was excessively added. Moreover, the perovskite compound (i.e., the precursor raw material) in Comparative Example 1 may be represented by a formula of Cs$_{0.3}$FA$_{0.7}$Pb(I$_{0.85}$Br$_{0.15}$)$_3$.

Property Evaluation

Figure 3:
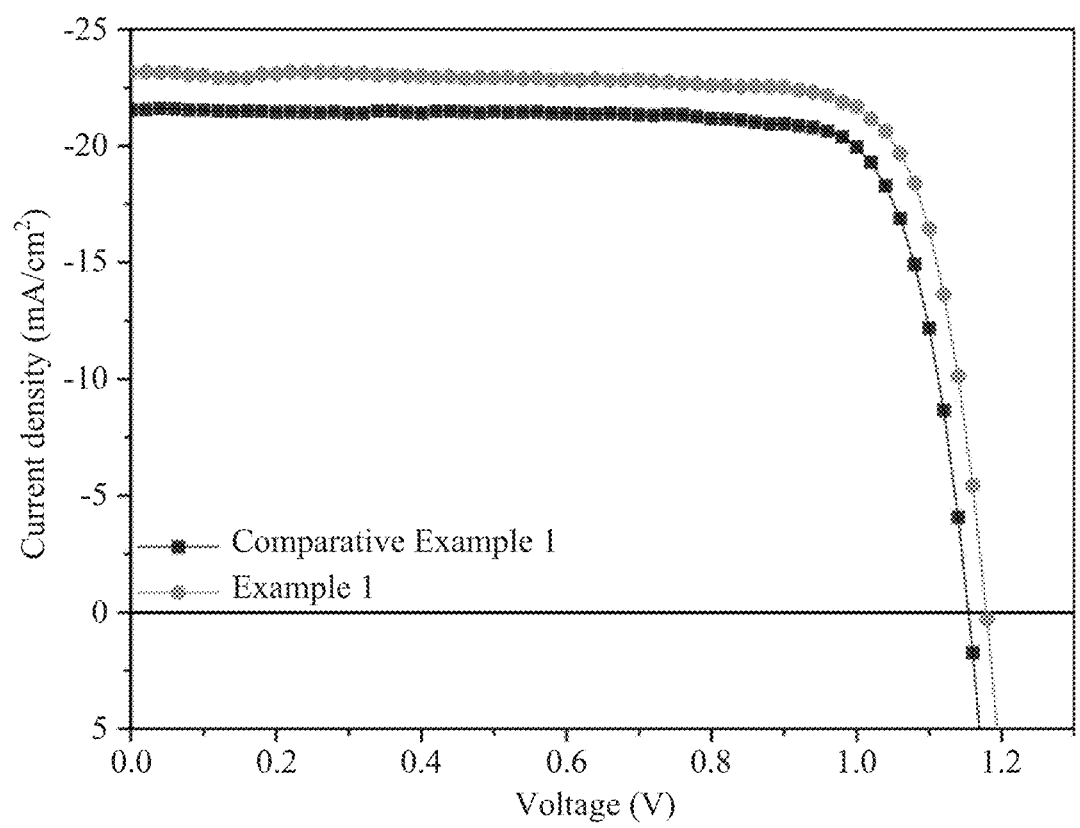
FIG. 3 is a current density-voltage graph showing curves of a respective one of perovskite solar cells of Example 1 and Comparative Example 1.

Each of the perovskite solar cells obtained in Example 1 and Comparative Example 1 was subjected to a measurement under 1.5 air mass (AM) light irradiation at 100 MW/cm$^2$ and with application of a bias voltage ranging from 1.2 V to −0.2 V, to thereby obtain a current density-voltage curve as shown in FIG. 3, a short-circuit current density (Jsc) and an open circuit voltage (Voc). After that, based on the measured short-circuit current density and open circuit voltage, a fill factor (FF) and a photoelectric conversion efficiency (PCE) of the perovskite solar cell was calculated, and the results were shown in Table 1 below.

The fill factor (FF) and the photoelectric conversion efficiency (PCE) were calculated using the following Equation (2):

$$PCE(\%) = \frac{P\max}{Pin} = FF \times \frac{Voc \times Jsc}{Pin} \quad (2)$$

where Pmax=the maximum output power of perovskite solar cell
Pin=power of light irradiation received by perovskite solar cell during measurement
Voc=open circuit voltage of perovskite solar cell
Jsc=short-circuit current density of perovskite solar cell

TABLE 1

|  | Formula of Perovskite | Jsc (mA/cm$^2$) | Voc (V) | FF (%) | PCE (%) |
|---|---|---|---|---|---|
| Example 1 | Rb$_{0.05}$(Cs$_{0.3}$FA$_{0.7}$)$_{0.95}$Pb(I$_{0.85}$Br$_{0.15}$)$_3$ | 23.16 | 1.18 | 79.26 | 21.58 |
| Comparative Example 1 | Cs$_{0.3}$FA$_{0.7}$Pb(I$_{0.85}$Br$_{0.15}$)$_3$ | 21.54 | 1.15 | 80.23 | 19.92 |

RESULTS

Referring to Table 1 and FIG. 3, compared with Comparative Example 1, the perovskite solar cell of Example 1 has a better short-circuit current density and open circuit voltage, and the photoelectric conversion efficiency is enhanced as well. Moreover, from the fill factors of the perovskite solar cells of Example 1 and Comparative Example 1, and also from FIG. 2, it can be inferred that by doping of M1 into the perovskite and applying such perovskite to the perovskite solar cell as in Example 1, not only the occurrence of phase separation caused by a large difference in radius between the cesium ion and the formamidinium ion can be prevented, but the quality of the perovskite solar cell still remains good enough.

In sum, the multiple cation-doped perovskite compound according to the present disclosure can achieve the effect of preventing the occurrence of photoinduced phase separation caused by the segregation of halide ions by means of adding cesium ions. In addition, by doping with M1, the problem of uneven phase separation owing to a greater difference in size between M2 and M3 (i.e., the cesium ion and the formamidinium ion) may be mitigated, and the multiple cation-doped perovskite compound may still retain a wide bandgap so that the perovskite solar cell 200 including the multiple cation-doped perovskite compound may exhibit good photoelectric conversion efficiency and quality. Furthermore, the multiple cation-doped perovskite compound is free from methylammonium ion, and hence has a good thermal stability.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A multiple cation-doped perovskite compound, comprising a perovskite represented by formula (II):

$$M1_s(M2_T M3_{1-T})_{1-S} B X_3 \quad \text{(II)}$$

wherein:
M1 represents a rubidium ion, M2 represents a cesium ion and M3 represents a formamidinium ion;
B represents a divalent cation different from M1, M2, and M3;
X includes at least two different halide ions;
S represents a value greater than 0 and lower than 0.1;
T represents a value greater than 0 and lower than 0.5; and
the perovskite compound is free from methylammonium ion.

2. The multiple cation-doped perovskite compound as claimed in claim 1, wherein the perovskite is represented by formula (III):

$$M1_s(M2_T M3_{1-T})_{1-S} B (X1_{1-U} X2_U)_3 \quad \text{(III)}$$

wherein:
X1 represents an iodide ion;
X2 represents a bromide ion; and
U represents a value greater than 0 and lower than 0.5.

3. The multiple cation-doped perovskite compound as claimed in claim 1, wherein B is selected from the group consisting of a lead ion, a tin ion and a germanium ion.

4. A perovskite solar cell, comprising:
a conductive layer;
a hole transport layer disposed on the conductive layer;
an absorption layer disposed on the hole transport layer opposite to the conductive layer, and including the multiple cation-doped perovskite compound as claimed in claim 1;
a passivation film disposed on the absorption layer opposite to the hole transport layer;
an electron transport layer disposed on the passivation film opposite to the absorption layer;
an electrode contact layer disposed on the electron transport layer opposite to the passivation film; and
an electrode layer disposed on the electrode contact layer opposite to the electron transport layer.

5. The perovskite solar cell as claimed in claim 4, wherein the hole transport layer is made of a material selected from the group consisting of a boronic acid derivative, a carboxylic acid derivative, a cyanoacetic acid derivative, and a phosphonic acid derivative.

6. The perovskite solar cell as claimed in claim 4, wherein the electron transport layer is made of a material selected from the group consisting of [6,6]-phenyl-C61-butyric acid methyl ester (PCBM), indene-C60 bisadduct (ICBA), fullerene $C_{60}$, fullerene $C_{70}$, and [6,6]-phenyl-C71-butyric acid methyl ester ($PC_{71}BM$).

7. The perovskite solar cell as claimed in claim 4, wherein the electrode layer is made of a material selected from the group consisting of silver, gold, copper, aluminum, palladium, nickel, indium tin oxide (ITO), fluorine-doped tin oxide (FTO), antimony-doped tin oxide (ATO), aluminum-doped zinc oxide (AZO), indium-doped zinc oxide (IZO), gallium-doped zinc oxide (GZO), indium tin zinc oxide (ITZO), indium gallium zinc oxide (IGZO), and combinations thereof.

* * * * *